US011569396B2

(12) United States Patent
Tuncer

(10) Patent No.: US 11,569,396 B2
(45) Date of Patent: Jan. 31, 2023

(54) OPTICAL SENSOR PACKAGE WITH OPTICALLY TRANSPARENT MOLD COMPOUND

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/088,963

(22) Filed: Nov. 4, 2020

(65) Prior Publication Data
US 2022/0140154 A1     May 5, 2022

(51) Int. Cl.
*H01L 31/0203*     (2014.01)
*H01L 31/02*     (2006.01)
*G01J 1/02*     (2006.01)
*H01L 31/173*     (2006.01)

(52) U.S. Cl.
CPC ........ *H01L 31/0203* (2013.01); *G01J 1/0204* (2013.01); *G01J 1/0271* (2013.01); *H01L 31/02002* (2013.01); *H01L 31/173* (2013.01)

(58) Field of Classification Search
CPC ........... H01L 31/0203; H01L 31/02002; H01L 31/173; G01J 1/0204; G01J 1/0271
See application file for complete search history.

(56) References Cited

U.S. PATENT DOCUMENTS

| 2002/0089025 A1* | 7/2002 | Chou | H01L 31/0203 |
| | | | 257/434 |
| 2003/0231841 A1* | 12/2003 | Nakanishi | G02B 6/4265 |
| | | | 385/92 |
| 2008/0090947 A1* | 4/2008 | Shin | C08L 83/00 |
| | | | 524/131 |
| 2010/0244286 A1* | 9/2010 | Lagsa | H01L 23/295 |
| | | | 257/E23.116 |

(Continued)

OTHER PUBLICATIONS

Solepoxy, Inc., "OP7000 Clear Molding Compound for SMT Light Sensors and Emitters," https://solepoxy.com, Oct. 21, 2020, 3pgs., SolEpoxy, Inc., USA.

(Continued)

*Primary Examiner* — Thanh Luu
*Assistant Examiner* — Monica T Taba
(74) *Attorney, Agent, or Firm* — Ronald O. Neerings; Frank D. Cimino

(57) ABSTRACT

An optical sensor package includes an IC die including a light sensor element, an output node, and bond pads including a bond pad coupled to the output node. A leadframe includes a plurality of leads or lead terminals, wherein at least some of the plurality of leads or lead terminals are coupled to the bond pads including to the bond pad coupled to the output node. A mold compound provides encapsulation for the optical sensor package including for the light sensor element. The mold compound includes a polymer-base material having filler particles including at least one of infrared or terahertz transparent particle composition pro- (Continued)

vided in a sufficient concentration so that the mold compound is optically transparent for providing an optical transparency of at least 50% for a minimum mold thickness of 500 μm in a portion of at least one of an infrared frequency range and a terahertz frequency range.

27 Claims, 2 Drawing Sheets

(56) References Cited

U.S. PATENT DOCUMENTS

| | | | |
|---|---|---|---|
| 2011/0079801 A1* | 4/2011 | Zhang | H01L 31/0203 257/E33.059 |
| 2014/0021491 A1* | 1/2014 | Meng | H01L 33/005 257/82 |
| 2018/0226514 A1* | 8/2018 | Etschmaier | G01J 1/0204 |
| 2019/0027657 A1* | 1/2019 | Shioji | H01L 33/504 |

OTHER PUBLICATIONS

Intersil Corporation, "Surface Mount Assembly Guidelines for Optical Dual FlatPack No Lead (ODFN) Package," Intersil Technical Brief, Oct. 24, 2016; pp. 1-5, TB466.2, Intersil Americas LLC, USA.

\* cited by examiner

OPTICAL SENSOR PACKAGE WITH OPTICALLY TRANSPARENT MOLD COMPOUND

FIELD

This Disclosure relates to optical sensor packages.

BACKGROUND

Sensing light in different parts (ranges) of the electromagnetic radiation spectrum (e.g., the visible spectrum/colors, ultraviolet (UV) light, and infrared (IR) light) generally need novel arrangements for proper sensor operation. For example, for optical sensor packages that sense in the IR and/or terahertz (THz), packaging materials that allow reliable operation along with high transmittance to enable high sensitivity are needed. Conventional mold compounds for semiconductor packages, such as conventional epoxy-based mold compounds, do not provide sufficient optical transparency to enable use in optical sensing applications.

As a result of the lack of mold compound optical transparency, conventional optical sensor packages are either configured as an open sensor package (being open to the air) or as a glass lid metallic sensor package having a cavity over the light sensor element, which are both relatively expensive packaging solutions. Moreover, such conventional optical sensor packages lack protection for the light sensor element of the integrated circuit (IC) die from the environmental stresses due to the air gap over at least the late sensor element which can result in high levels of moisture absorption, pollution, and impact damage, which each can adversely impact the performance of the optical sensor.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects solve the problem of conventional relatively expensive optical sensor package solutions for IR and/or THz sensing comprising an open cavity or a glass lid metallic package needed because the mold compound is not sufficiently optically transparent so that the package solution does not encapsulate the light sensing element, by adding IR and/or THz transparent filler particle composition(s) into a mold compound. Disclosed filler particles render the mold compound IR and/or THz transparent in at least a portion of the IR and/or THz ranges. The base mold material generally comprises a polymer which can comprise conventional mold compounds, including epoxy-based mold compounds. Disclosed mold materials fully encapsulate the light sensor element, generally encapsulating the entire IC die.

Disclosed aspects include an optical sensor package comprising an IC die including at least a light sensor element, having an output node, and bond pads including a bond pad coupled to the output node. A leadframe includes a plurality of leads or lead terminals, wherein at least some of the leads or lead terminals are coupled to the bond pads, including to the bond pad coupled to the output node. A mold compound provides encapsulation for the optical sensor package including for at least the light sensor element.

The mold compound comprises a polymer-based material having filler particles including at least one IR or THz transparent particle composition that is provided in a sufficient concentration so that the mold compound is optically transparent. As used herein the term "optically transparent" for a mold compound means an optical transparency of the mold material is at a minimum % based on an objective set of measurement conditions including a frequency range and a mold thickness. Specifically, "optically transparent" for a mold compound herein is a mold compound that provides an optical transparency of at least 50% for a minimum mold thickness of 500 µm (0.5 mm) over a portion of at least one of an IR frequency range and a THz frequency range. Disclosed mold compounds enable a conventional semiconductor assembly process based on molding processes including injection molding or transfer-molding, to be used for IR and/or THz sensor packages including receiving devices and/or transmitting devices.

BRIEF DESCRIPTION OF THE DRAWINGS

Reference will now be made to the accompanying drawings, which are not necessarily drawn to scale, wherein.

DETAILED DESCRIPTION

Figure 1:
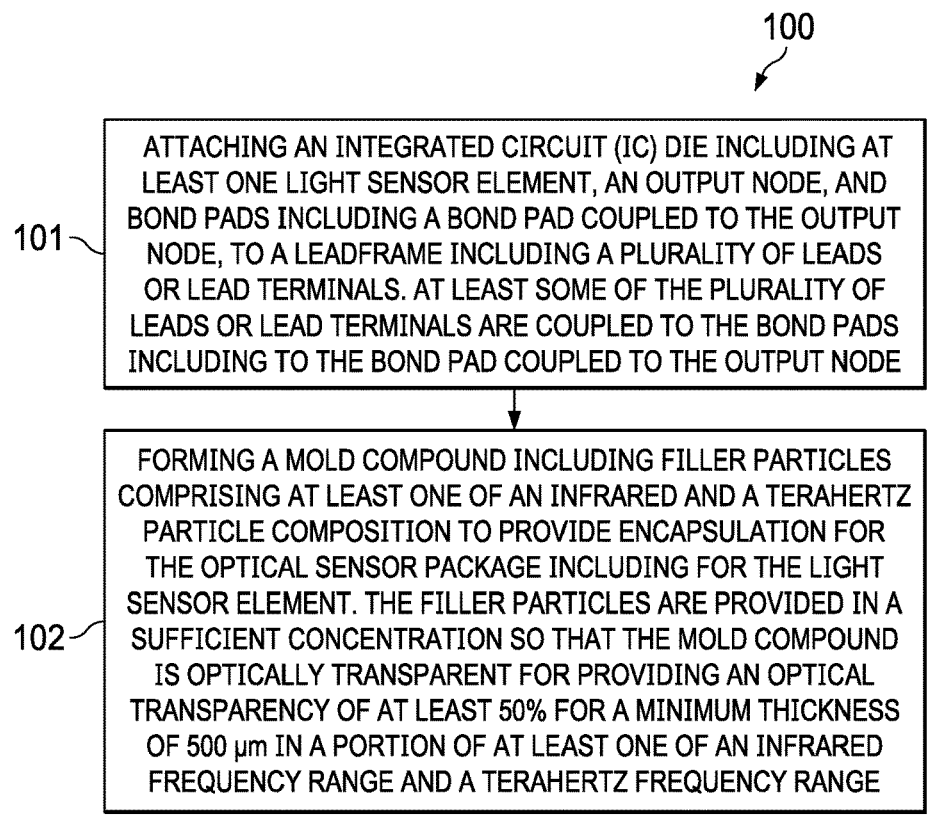
FIG. 1 is a flow chart that shows steps in an example method for forming an optical sensor package including a disclosed IR and/or THz transparent mold compound, according to an example aspect.

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 for forming an optical sensor package including a disclosed infrared IR and/or infrared THz transparent mold compound, according to an example aspect. Step 101 comprises attaching an IC die including at least one light sensor element, an output node, and bond pads including a bond pad coupled to the output node, to a leadframe including a plurality of leads or lead terminals. At least some of the plurality of leads or lead terminals are coupled to the bond pads including to the bond pad coupled to the output node. The light sensor element can comprise a photodiode or a phototransistor. The method for conventional IC die up attachment to the leadframe can further comprise wirebonding after the attaching to provide a connection between the bond pads and the leads or the lead terminals.

Step 102 comprises forming a mold compound including filler particles comprising at least one of an IR and a THz particle composition to provide encapsulation for the optical sensor package including for the light sensor element. The filler particles are provided in a sufficient concentration so that the mold compound is optically transparent for providing an optical transparency of at least 50% for a minimum thickness of 500 µm in a portion of at least one of an IR frequency range and a THz frequency range. The forming can comprise blending a polymer or a polymer precursor with filler particles including at least one IR or THz transparent particle composition to form a blended mixture, and then molding the blended mixture to form the mold compound.

Regarding what is meant herein by the term IR and THz radiation, IR, sometimes called infrared light, is electromagnetic radiation with wavelengths longer than visible light which has a wavelength generally from 400 nm to 700 nm (the red outer edge). IR is generally at a wavelength of at least 700 nm. IR wavelengths in an IR wavelength range as used herein extend from the nominal red edge of the visible spectrum at 700 nanometers (equal to a frequency of 430 THz), to 1 millimeter (300 GHz). The THz wavelengths being in a THz wavelength range as used herein refers to electromagnetic waves with wavelengths between 3 mm and 30 µm, equal to frequencies between 100 GHz and 10 THz, thus overlapping a lowest frequency portion of the IR spectrum. THz waves are also sometimes referred to as far-IR waves or as sub-millimeter waves.

The filler particles are generally in a concentration of at least 50 weight % of the mold compound. A size of the filler particles is generally primarily (meaning over 50% in number) in the nanosize range. The filler particles are provided in a sufficient concentration so that the mold compound is optically transparent for providing an optical transparency of at least 50% for a minimum mold thickness of 500 µm (0.5 mm) in a portion of at least one of an IR frequency range and a THz frequency range.

Disclosed filler particles that can comprise inorganic particles, ceramic, or glass particles, provided that they are optically transparent to IR and THz frequencies, which allows for either transmitting or receiving IR and THz signals through the mold compound having such particles. Disclosed mold compounds including such filler particles will act as a filter, meaning providing signal or noise blocking outside the IR and THz frequencies. Examples of filler particles that can be used in disclosed mold compounds can in, specific examples, comprise a yttrium oxide ($Y_2O_3$) and magnesium oxide (MgO) mixture, as well as Ga—Ge—Sb—Se glass particle mixture, which are examples of filler mixtures having high IR and/or THz transmission. For example, $Y_2O_3$ and MgO mixtures can provide a mold compound 500 µm (0.5 mm) thick more than a 70% transparency over a wavelength band from 2 µm to 7.5 µm.

The volume fraction or the weight fraction of such filler particles can be higher in the mold compound as compared to the percolation threshold of the mold compound. The percolation threshold is a mathematical concept in percolation theory that describes the formation of long-range connectivity in random systems. For disclosed aspects, the connectivity involves the passage of the IR and/or THz signal through the mold compound without any significant signal blockage, so that the filler particles in the mold compound need to be close enough to one another, such as touching one another, or being less than micrometers apart when mold compound is formed. For example, the volume fraction of the particles can be >33% of the volume of the mold compound when spherical particles are considered. It is recognized having the total volume fraction and/or the total weight fraction of such filler particles higher in the mold compound as compared to the percolation threshold enables the IR and/or THz transmission level to be high enough for IR and THz receiving by a suitable light to electrical transducer, such as a photodiode or a phototransistor, or for IR and/or THz transmitting by a suitable light sensor (such as a light-emitting diode (LED) or LED array) used for converting an electrical signal into emitted light.

As noted above, the forming a mold compound (step 102) can comprise optionally blending a polymer or a polymer precursor with filler particles form a blended mixture, and then molding a blended mixture to form a mold compound to provide encapsulation for the optical sensor package. As noted above, the filler particles are provided in a sufficient concentration so that the mold compound is optically transparent for providing an optical transparency of at least 50% for a minimum mold thickness of 500 µm in a portion of at least one of an IR frequency range and a THz frequency range.

The blending can comprise mechanical mixing of a polymer precursor which can comprise in one example a liquid epoxide, the filler particles, and a hardener. The liquid epoxide and the hardener are generally stored separately before being mixed and are cured during the molding process. The blending can also comprise kneading the polymer which can comprise a solid epoxy material and the filler particles.

The molding can comprise injection molding or transfer molding. Compared to injection molding, transfer molding generally uses higher pressures to uniformly fill the mold cavity. This generally allows thicker reinforcing fiber matrices to be more completely saturated by resin. However, the transfer molding process may have a slower fill rate than an equivalent injection molding process.

Advantages of disclosed mold compounds include allowing implementation of molded packages having sufficient optical transparency for the light sensor element on the IC die during reception to provide sensing in the IR and/or THz frequency range through the mold compound, and/or to provide transmission of light emitted from a light-emitting device such as an LED. Also, conventional methods of assembly can be utilized with a disclosed mold compound.

Types of optical sensor packages that can utilize disclosed mold compounds can generally include any package type that uses a mold compound. For example, conventional leaded packages or surface-mount packages can include a small outline integrated circuit (SOIC) package, leadless packages such as a quad-flat no-lead (QFN) package or dual-flat no-lead (DFN) package, and a small outline transistor (SOT) package.

Figure 2A:
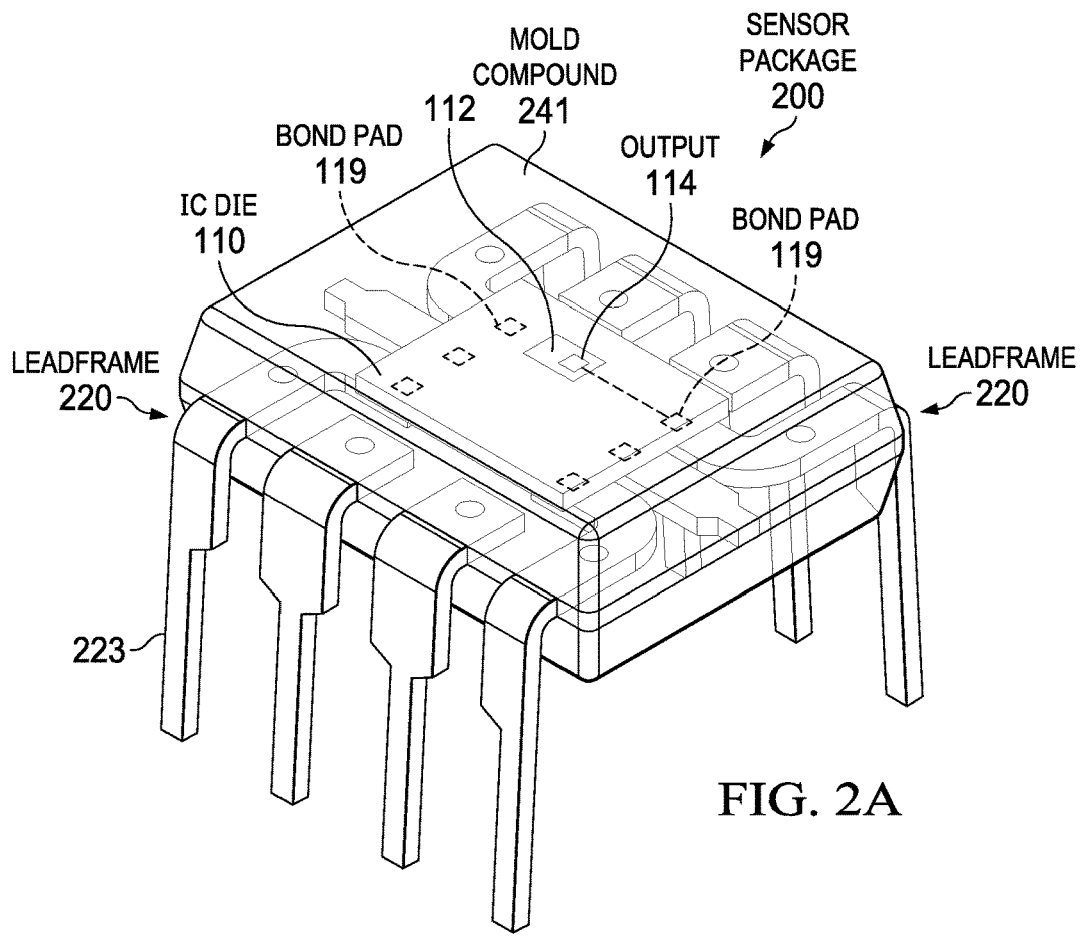
FIG. 2A depicts an optical sensor package shown as a flipchip on lead (FCOL) package including an IC die that includes an integrated IR sensor having an IR transparent mold compound, according to an example aspect.

FIG. 2A is a depiction of an optical sensor package 200 shown as an FCOL package, including an IC die 110 comprising a light sensor element 112 integrated on the IC described as being an IR sensor having a mold compound 241 that is IR transparent, according to an example aspect. The optical sensor package 200 can be based on the Texas Instruments (TI) OPT101P sensor package other than the mold compound utilized. Although not shown, there is generally a non-electrically conductive die attach material used for the die attachment of the IC die 110 to the leadframe 220.

The light sensor element 112 has an associated output node 114, and bond pads (shown in phantom) including a bond pad 119 shown coupled to the output node 114. The light sensor element 112 can directly provide the output node 114, or indirectly provide the output node 114 by being indirectly connected to the output node, such as by having an intervening amplifier (see FIG. 3 described below). The leadframe 220 is shown having leads 223, wherein at least some of the leads 223 are attached by generally a solder joint connection to the bond pads including to the bond pad 119, where bond pad 119 as noted above is coupled to the output node 114. Alternatively, the leadframe for the FCOL package can be a leadless leadframe, such as a QFN leadframe.

The mold compound 241 provides encapsulation for the optical sensor package 200 including for the light sensor element 112. The mold compound 241 comprises a polymer-base material including filler particles comprising at least one of IR and THz transparent particle composition. As noted above, the filler particles are provided in a sufficient concentration so that the mold compound 241 is optically transparent for providing an optical transparency of at least 50% for a minimum mold thickness of 500 μm in a portion of at least one of an IR frequency range and a THz frequency range.

Figure 2B:
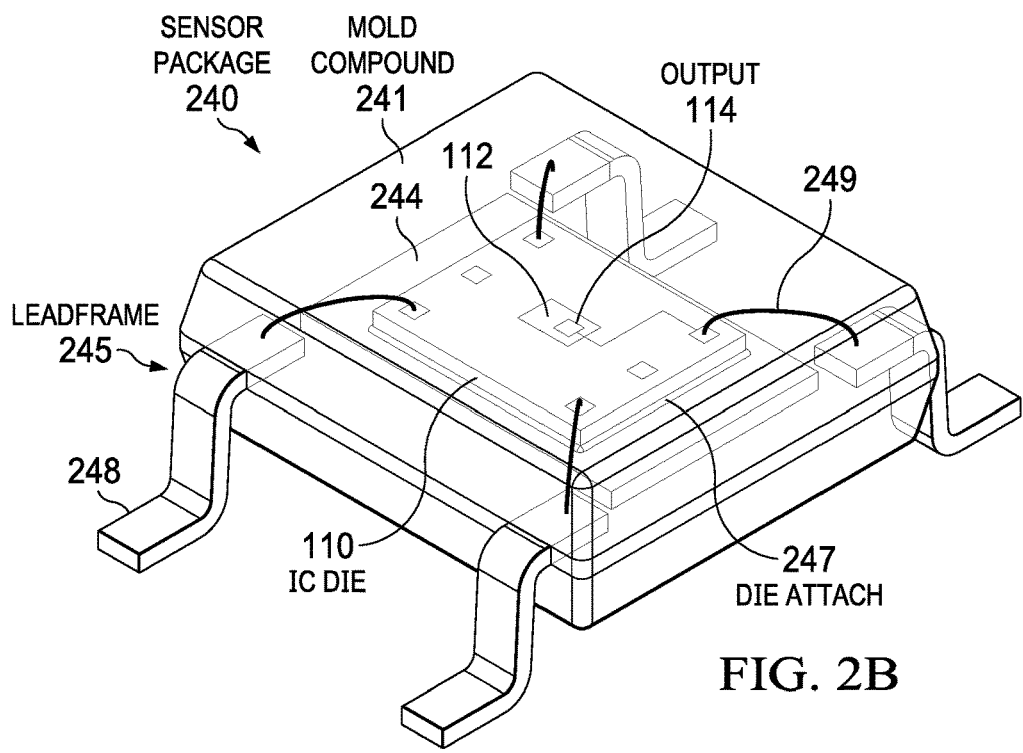
FIG. 2B depicts an optical sensor package shown as a wirebond package including an IC die that includes an integrated IR sensor having an IR transparent mold compound, according to an example aspect.

FIG. 2B is a depiction an optical sensor package 240 shown as a wirebond dual inline (DIP) package including an IC die 110 comprising a light sensor element 112 described as being an integrated IR sensor, the optical sensor package 240 having an IR transparent mold compound 241, according to an example aspect. As with the optical sensor package 200 shown in FIG. 2A, the light sensor element 112 has an output node 114, and bond pads include a bond pad 119 coupled to the output node 114. In this arrangement, the die attach material shown as 247 on the die pad 244 can be electrically conductive or can be electrically non-conductive. The leadframe 245 includes leads shown as 248, wherein at least some of the leads for eight are shown coupled by bond wires 249 to the bond pads including to the bond pad 119 which is coupled to the output node 114.

The mold compound 241 provides encapsulation for the area of the optical sensor package 240 including for the light sensor element 112. As noted above, the mold compound 241 comprises a polymer-base material including filler particles comprising at least one of IR and THz transparent particle composition. Moreover, as noted above, the filler particles are provided in a sufficient concentration so that the mold compound 241 is optically transparent for providing an optical transparency of at least 50% for a minimum mold thickness of 500 μm in a portion of at least one of an IR frequency range and a THz frequency range.

Figure 3:
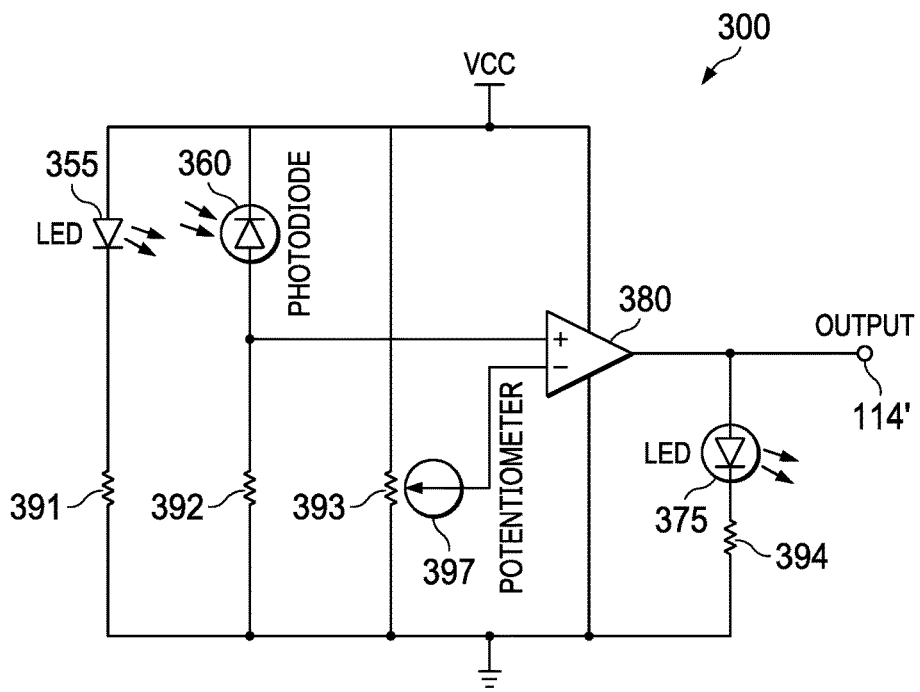
FIG. 3 depicts an example of respective functional components and their interconnection for the IC die having the integrated IR sensor shown in the optical sensor packages of FIGS. 2A and 2B.

FIG. 3 depicts the respective functional components and their interconnection for the optical sensor packages 200 and 240 shown in FIGS. 2A and 2B, with the functional components and their interconnection shown collectively as 300. The optical sensor includes the light sensor element 112 shown in FIG. 2A now as photodiode 360 that functions as an IR photodetector, and there is also an LED 355 that emits in the IR which is directed towards the photodiode 360. There is a resistor 391 between the LED 355 and the circuit ground shown. There is a resistor 394 shown in series with a second LED 375 positioned between the output node 114' and the ground.

There are other resistors included shown as photodiode series resistor 392 between the photodiode 360 and ground, and a resistor 393. Resistors 392, 393 are coupled to the plus (+) or noninverting input and the minus (−) or inverting input of the operational amplifier 380, respectively. The LED 355 emits IR light towards the photodiode 360. The photodiode 360 detects this IR light. The operational amplifier 380 is configured as a voltage comparator. A potentiometer 397 shown applied to resistor 393 can be used to calibrate the signal level at the output node 114' of the optical sensor package according to a given customer's requirement.

When the light emitted by the LED 355 is incident on the photodiode 360 after hitting an object, the resistance of the photodiode 360 falls down from a larger resistance value. The inverting input of the operational amplifier 380 is at a threshold value set by the potentiometer 397 applied to the resistor 393. The voltage at the noninverting input of the operational amplifier 380 as described above is set by the photodiode's series resistor 392. When the incident IR radiation is on the photodiode 360, the voltage drop across the photodiode series resistor 392 will be increased, raising the voltage at the noninverting input of the operational amplifier 380.

The operational amplifier 380 thus compares at its respective inputs the threshold voltage set by the potentiometer 397 and the voltage across the photodiode series resistor 392. If the voltage across the photodiode series resistor 392 is greater than that of the threshold voltage, the output of the operational amplifier 380 shown as 114' is high. As the output of the operational amplifier 380 is connected to the second LED 375, this results in the second LED 375 lighting up. The threshold voltage can be adjusted by adjusting the potentiometer 397 associated with the resistor 393 depending on the environmental conditions.

The positioning of the LED 355 can be a significant factor in a given application. When the LED 355 is held directly in front of the photodiode 360 acting as an IR receiver, this setup arrangement is generally referred to as direct incidence. In this case, almost all the radiation from the LED 355 will be incident on the photodiode 360. Accordingly, there is a line of sight communication between the LED 355 functioning as an IR transmitter and the photodiode 360 functioning as a receiver. If an object falls within this line of sight, the object obstructs the IR radiation emitted from LED 355 from reaching the photodiode 360 by either by reflecting the IR radiation or by absorbing the IR radiation.

EXAMPLES

Disclosed aspects are further illustrated by the following specific Examples, which should not be construed as limiting the scope or content of this Disclosure in any way.

This Example is regarding a THz radar package comprising a THz radar sensor IC die that can utilize disclosed mold compound technology, instead of utilizing a conventional open cavity THz radar package which as described above does not protect the light sensor element of the THz radar sensor IC die from the environmental stresses due to the air gap over the sensor element. As noted above, exposure of the light sensor element to the ambient can result in high moisture absorption, pollution, and impact damage. With regard to assembly processing for forming a disclosed mold compound, an IR transparent particle filler combination comprising $Y_2O_3$ and MgO particles and a polymer precursor comprising a liquid epoxide were blended in a Henschel MIXER® for three minutes at 1,500 rpm. Other ingredients, such as one or more of fire retardants, ion trappers, or adhesion promoters, were also added to the mixer, and the mix was blended in the same mixer for about six minutes at 1,800 rpm to provide a blended mixture.

The blended mixture was then extruded using a twin-screw extruder having a first and second mixing zone. The first mixing zone was maintained at a temperature of about 80° C., and the second mixing zone was maintained at a temperature of about 100° C. The screw speed of the extruder was maintained at a speed of about 400 rpm. Extrudate was compressed between two water-cooled rollers, collected, and granulated on a granulater. The granulated molding compound was stored at about 4° C. until molded to enable forming a THz radar package that fully encapsulates the THz radar IC die.

As an alternative to using a liquid precursor, one can also use a solid polymer material, such as a solid epoxy. In this method, the blender for blending the filler particles can comprise a BRABENDER blender (Brabender Technologie) that provides a low shear-rate design which creates a tumbling and kneading force within the mixer. Thus, a disclosed mold compound can also be formed with a solid epoxy using kneading as the blending process to blend a solid epoxy material with the particle fillers. Following blending by the Brabender blender, there is generally a process to granulate and pelletize the blended mixture.

Disclosed aspects can be integrated into a variety of assembly flows to form a variety of different semiconductor-based optical sensor products. The assembly can comprise a single IC die or multiple IC die, such as configurations comprising a plurality of stacked IC die or laterally disposed IC die. A variety of package substrates may be used. The IC die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. An optical sensor package, comprising:
an integrated circuit (IC) die including at least a light sensor element, an output node, and bond pads including a bond pad coupled to the output node;
a leadframe including a plurality of leads or lead terminals, wherein at least some of the plurality of leads or lead terminals are coupled to the bond pads including to the bond pad coupled to the output node, and
a mold compound providing encapsulation for the optical sensor package including for the light sensor element, the mold compound comprising a polymer-base material including filler particles comprising a terahertz transparent particle composition,
wherein the filler particles are provided in a sufficient concentration so that the mold compound is optically transparent for providing an optical transparency of at least 50% for a minimum thickness of 500 μm in a portion of a terahertz frequency range.

2. The optical sensor package of claim 1, wherein the sufficient concentration of the filler particles comprises at least 50 weight % of the mold compound.

3. The optical sensor package of claim 1, wherein a size of the filler particles is primarily in a nanosize range.

4. The optical sensor package of claim 1, wherein the filler particles comprise ceramic particles.

5. The optical sensor package of claim 4, wherein the ceramic particles comprise $Y_2O_3$ and MgO.

6. The optical sensor package of claim 1, wherein the filler particles comprise a plurality of different glass compositions.

7. The optical sensor package of claim 1, further comprising an amplifier coupled to receive a signal provided by the light sensor element, wherein an output of the amplifier provides the output node.

8. The sensor package of claim 1, wherein the light sensor element comprises a photodiode or a phototransistor.

9. The sensor package of claim 1, further comprising at least one light-emitting diode (LED) coupled between the output node and a ground.

10. The sensor package of claim 1, wherein the polymer-based material comprises an epoxy.

11. The optical sensor package of claim 1, wherein the mold compound covers at least a portion of the bottom side of the leadframe.

12. The optical sensor package of claim 11, wherein the portion of the leadframe covered by the mold compound includes at least some of the leads or lead terminals.

13. The optical sensor package of claim 11, wherein the filler particles are infrared particles and the terahertz particles.

14. A method of assembly for an optical sensor package, comprising:
attaching an integrated circuit (IC) die including at least one light sensor element, an output node, and bond pads including a bond pad coupled to the output node to a leadframe including a plurality of leads or lead terminals, wherein at least some of the plurality of leads or lead terminals are coupled to the bond pads including to the bond pad coupled to the output node, and
forming a mold compound including filler particles comprising a terahertz transparent particle composition to provide encapsulation for the optical sensor package including for the light sensor element,
wherein the filler particles are provided in a sufficient concentration so that the mold compound is optically transparent for providing an optical transparency of at least 50% for a minimum thickness of 500 μm in a portion of a terahertz frequency range.

15. The method of claim 14, wherein the forming comprises:
blending a polymer or a polymer precursor with the filler particles to form a blended mixture, and
molding the blended mixture to form the mold compound.

16. The method of claim 15, wherein the blending comprises mechanical mixing of the polymer precursor which comprises a liquid epoxide, the filler particles, and a hardener.

17. The method of claim 15, wherein the blending comprises kneading the polymer which comprises a solid epoxy and the filler particles.

18. The method of claim 14, wherein the method further comprises wirebonding after the attaching to provide a connection between the bond pads and the leads or the lead terminals.

19. The method of claim 14, wherein the sufficient concentration of the filler particles comprises at least 50 weight % of the mold compound.

20. The method of claim 14, wherein a size of the filler particles is primarily in a nanosize range.

21. The method of claim 14, wherein the molding comprises transfer molding.

22. The method of claim 14, wherein the filler particles comprise ceramic particles comprising at least one of $Y_2O_3$ and MgO.

23. The method of claim 14, wherein the filler particles comprise a plurality of different glass compositions.

24. The method of claim 14, wherein the mold compound covers at least a portion of the bottom side of the leadframe.

25. The method of claim 24, wherein the portion of the leadframe covered by the mold compound includes at least some of the leads or lead terminals.

26. The method of claim 24, wherein the filler particles are infrared particles and the terahertz particles.

27. An optical sensor package, comprising:

an integrated circuit (IC) die including at least a light sensor element, an output node, and bond pads including a bond pad coupled to the output node;

a leadframe including a plurality of leads or lead terminals, wherein at least some of the plurality of leads or lead terminals are coupled to the bond pads including to the bond pad coupled to the output node; and a mold compound providing encapsulation for the optical sensor package including for the light sensor element, the mold compound comprising a polymer-base material including filler particles comprising infrared and terahertz transparent particle composition, at least a portion of the bottom side of the leadframe being covered by the mold compound, wherein the filler particles are provided in a sufficient concentration so that the mold compound is optically transparent for providing an optical transparency of at least 50% for a minimum thickness of 500 μm in a portion of at least one of an infrared frequency range and a terahertz frequency range.

* * * * *